(12) United States Patent
Huemoeller et al.

(10) Patent No.: US 11,545,405 B2
(45) Date of Patent: *Jan. 3, 2023

(54) PACKAGING FOR FINGERPRINT SENSORS AND METHODS OF MANUFACTURE

(71) Applicant: Amkor Technology Singapore Holding Pte. Ltd., Valley Point, AZ (US)

(72) Inventors: Ronald Patrick Huemoeller, Gilbert, AZ (US); David Bolognia, Scottsdale, AZ (US); Robert Francis Darveaux, Gilbert, AZ (US); Brett Arnold Dunlap, Queen Creek, AZ (US)

(73) Assignee: Amkor Technology Singapore Holding Pte. Ltd., Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 16/857,907

(22) Filed: Apr. 24, 2020

(65) Prior Publication Data

US 2020/0365480 A1 Nov. 19, 2020

Related U.S. Application Data

(60) Continuation of application No. 15/695,478, filed on Sep. 5, 2017, now Pat. No. 10,636,717, which is a
(Continued)

(51) Int. Cl.
*H01L 23/552* (2006.01)
*H01L 23/31* (2006.01)
(Continued)

(52) U.S. Cl.
CPC ...... *H01L 23/3128* (2013.01); *G06V 40/1306* (2022.01); *G06V 40/1329* (2022.01);
(Continued)

(58) Field of Classification Search
CPC . H01L 23/3128; H01L 21/561; H01L 21/568; H01L 24/17; H01L 24/19;
(Continued)

(56) References Cited

U.S. PATENT DOCUMENTS

| 2005/0104149 A1* | 5/2005 | Bauer | H01L 23/66 |
| | | | 257/E25.023 |
| 2008/0267462 A1* | 10/2008 | Nelson | G06K 9/00053 |
| | | | 382/124 |

(Continued)

FOREIGN PATENT DOCUMENTS

KR 10-2009-0031360 3/2009

OTHER PUBLICATIONS

Notice of Office Action of Korean Patent Application No. 10-2020-0109366.

*Primary Examiner* — Mohammad M Choudhry
(74) *Attorney, Agent, or Firm* — McAndrews, Held & Malloy, Ltd.

(57) ABSTRACT

A fingerprint sensor package, including a sensing side for sensing fingerprint information and a separate connection side for electrically connecting the fingerprint sensor package to a host device, is disclosed. The fingerprint sensor package can also include a sensor integrated circuit facing the sensing side and substantially surrounded by a fill material. The fill material includes vias at peripheral locations around the sensor integrated circuit. The fingerprint sensor package can further include a redistribution layer on the sensing side which redistributes connections of the sensor integrated circuit to the vias. The connections can further be directed through the vias to a ball grid array on the connection side. Some aspects also include electrostatic
(Continued)

discharge traces positioned at least partially around a perimeter of the connection side. Methods of manufacturing are also disclosed.

20 Claims, 11 Drawing Sheets

Related U.S. Application Data continuation of application No. 15/225,565, filed on Aug. 1, 2016, now Pat. No. 9,754,852, which is a division of application No. 13/420,188, filed on Mar. 14, 2012, now Pat. No. 9,406,580.

(60) Provisional application No. 61/453,460, filed on Mar. 16, 2011.

(51) Int. Cl.
*H01L 21/56* (2006.01)
*H01L 23/00* (2006.01)
*G06V 40/13* (2022.01)

(52) U.S. Cl.
CPC .......... *H01L 21/561* (2013.01); *H01L 21/568* (2013.01); *H01L 24/17* (2013.01); *H01L 24/19* (2013.01); *H01L 24/96* (2013.01); *H01L 2224/73267* (2013.01); *H01L 2924/00* (2013.01); *H01L 2924/10253* (2013.01); *H01L 2924/12041* (2013.01); *H01L 2924/12042* (2013.01)

(58) Field of Classification Search
CPC .......... H01L 24/96; H01L 2224/73267; G06K 9/0002; G06K 9/00053
See application file for complete search history.

(56) References Cited

U.S. PATENT DOCUMENTS

| | | |
|---|---|---|
| 2008/0290353 A1 | 11/2008 | Medendorp, Jr. et al. |
| 2008/0296716 A1* | 12/2008 | Chan ...................... H01L 21/56 257/433 |
| 2010/0039121 A1* | 2/2010 | Iliev ...................... G06K 9/0002 324/658 |
| 2012/0119373 A1* | 5/2012 | Hunt .................. H01L 21/4857 257/774 |

* cited by examiner

PACKAGING FOR FINGERPRINT SENSORS AND METHODS OF MANUFACTURE

CROSS-REFERENCE TO RELATED APPLICATIONS/INCORPORATION BY REFERENCE

This Application is a continuation of U.S. application Ser. No. 15/695,478, filed Sep. 5, 2017, and titled "PACKAGING FOR FINGERPRINT SENSORS AND METHODS OF MANUFACTURE," expected to issue as U.S. Pat. No. 10,636,717; which is a continuation of U.S. application Ser. No. 15/225,565, filed Aug. 1, 2016, and titled "PACKAGING FOR FINGERPRINT SENSORS AND METHODS OF MANUFACTURE," now U.S. Pat. No. 9,754,852; which is a divisional of U.S. patent application Ser. No. 13/420,188, filed Mar. 14, 2012, and titled PACKAGING FOR FINGERPRINT SENSORS AND METHODS OF MANUFACTURE," now U.S. Pat. No. 9,406,580; which claims priority to U.S. Provisional Application 61/453,460, entitled PACKAGING FOR FINGERPRINT SENSORS AND METHODS OF MANUFACTURE, filed on Mar. 16, 2011; each of which is hereby incorporated herein by reference in its entirety.

BACKGROUND OF THE DISCLOSED SUBJECT MATTER

Conventional fingerprint sensors include an integrated circuit, such as a silicon die, with an exposed top surface portion for receiving human touch. Due to the exposed top surface, packaging of the integrated circuit can be difficult. For example, conventional packages encapsulate the integrated circuit while exposing a portion of the top surface, but must provide room for wire connections from the top surface to peripheral connection points on a substrate below the integrated circuit. The substrate is provided with additional connection points in order to allow connection of the fingerprint sensor package to a host device. See, U.S. Pat. No. 7,251,351 issued Jul. 31, 2007, to Mathiassen et al. for Sensor Unit, Especially for Fingerprint Sensors; U.S. Pat. No. 671,041 issued Mar. 23, 2004, to Chou et al. for Wafer Level Packing of Micro Electromechanical Device.

Some fingerprint sensors provide the silicon die attached to an underside of a flexible substrate, where human touch over the top of the flexible substrate can be sensed indirectly by the silicon die, as discussed in U.S. Pat. No. 7,099,496, issued to Benkley, on Aug. 29, 2006, entitled SWIPED APERTURE CAPACITIVE FINGERPRINT SENSING SYSTEMS AND METHODS, and U.S. Pat. No. 7,751,601, issued on Jul. 6, 2010, to Benkley, entitled FINGER SENSING ASSEMBLIES AND METHODS OF MAKING, both of which are assigned to the assignee of the present application and incorporated by reference. In such fingerprint sensors, the silicon die is either attached directly under the surface to be touched for sensing through the flexible substrate, or attached remote from the surface to be touched and a separate array of metal traces in communication with the silicone die is located directly under the surface to be touched for sensing through the flexible substrate. Rigid substrates or rigid bases must be coupled to the flexible substrate or positioned under the flexible substrate to provide support for the flexible substrate and/or the silicon die when connected to a host device.

Kim et al., "Application of Through Mold Via (TMV) as PoP Base Package," 2008 Electronic Components and Technology Conference, IEEE (2008) discusses the application of through mold vias ("TMV") in a "fan-out" wafer level packaging ("WLFO package") arrangement for a package on package ("PoP") device. The disclosure of Kim et al. is incorporated by reference.

SUMMARY

An aspect of the disclosed subject matter provides a fingerprint sensor package including a sensing side for sensing fingerprint information and a separate connection side for electrically connecting the fingerprint sensor package to a host device. The fingerprint sensor package can also be adapted and configured to include a sensor integrated circuit facing the sensing side and substantially surrounded by a fill material. Additionally, the fill material can include vias at peripheral locations around the sensor integrated circuit. The fingerprint sensor package can further be adapted and configured to include a redistribution layer on the sensing side which redistributes connections of the sensor integrated circuit to the vias. The connections can further be directed through the vias to a ball grid array on a connection side. Some aspects also include electrostatic discharge traces positioned at least partially around a perimeter of the connection side.

Another aspect of the disclosure provides for the fabrication of the sensors.

INCORPORATION BY REFERENCE

All publications, patents, and patent applications mentioned in this specification are herein incorporated by reference to the same extent as if each individual publication, patent, or patent application was specifically and individually indicated to be incorporated by reference, for all possible purposes and to the same extent as if the disclosure of which was reproduced in the present application in its entirety.

BRIEF DESCRIPTION OF THE DRAWINGS

The novel features of the disclosed subject matter are set forth with particularity in the appended claims. A better understanding of the features and advantages of the present disclosed subject matter will be obtained by reference to the following detailed description that sets forth illustrative embodiments, in which the principles of the disclosed subject matter are utilized, and the accompanying drawings of which:

DETAILED DESCRIPTION

Figure 1:
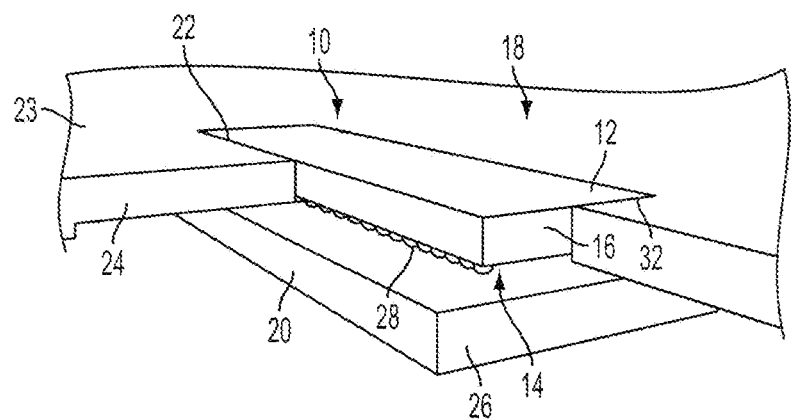
FIG. 1 is a perspective view of a fingerprint sensor package incorporated into a host device with a flush configuration.

The following discussion is presented to enable a person skilled in the art to make and use embodiments of the disclosed subject matter. Various modifications to the illustrated embodiments will be readily apparent to those skilled in the art, and the generic principles herein can be applied to other embodiments and applications without departing from embodiments of the disclosed subject matter. Thus, embodiments of the disclosed subject matter are not intended to be limited to embodiments shown, but are to be accorded the widest scope consistent with the principles and features disclosed herein. The following detailed description is to be read with reference to the figures, in which like elements in different figures have like reference numerals. The figures, which are not necessarily to scale, depict selected embodiments and are not intended to limit the scope of embodiments of the disclosed subject matter. Skilled artisans will recognize the examples provided herein have many useful alternatives which fall within the scope of embodiments of the disclosed subject matter and/or the appended claims.

Figure 2:
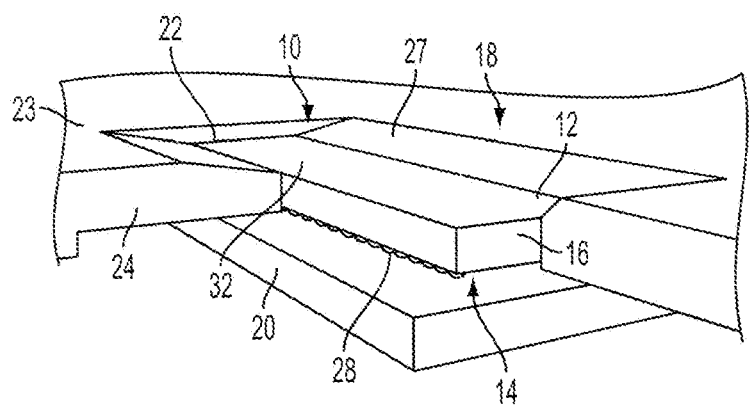
FIG. 2 is another perspective view of a fingerprint sensor package incorporated into a host device with a beveled configuration.

FIGS. 1 and 2 illustrate a package 10 for a biometric object sensor, e.g., a fingerprint sensor package 10, according to aspects of the disclosed subject matter. The fingerprint sensor package 10 can include a sensing side 12, a connection side 14, and a mold filler material 16 between the sensing side 12 and the connection side 14. As shown in FIGS. 1 and 2, the fingerprint sensor package 10 can be incorporated into a separate product or device 18 (e.g., a host device). For example, the connection side 14 can be electrically coupled to a substrate 20 of the device 18 and the sensing side 12 can be exposed through a cutout 22 in a device housing 24 of the device 18. In one aspect, the sensing side 12 can be flush with an outer surface 23 of the device housing 24, as shown in FIG. 1. In another aspect, the device housing 24 can be beveled, i.e., formed with bevels 27 around the cutout 22 so that the sensing side 12 can be substantially below the outer surface 23, as shown in FIG. 2.

Figure 3:
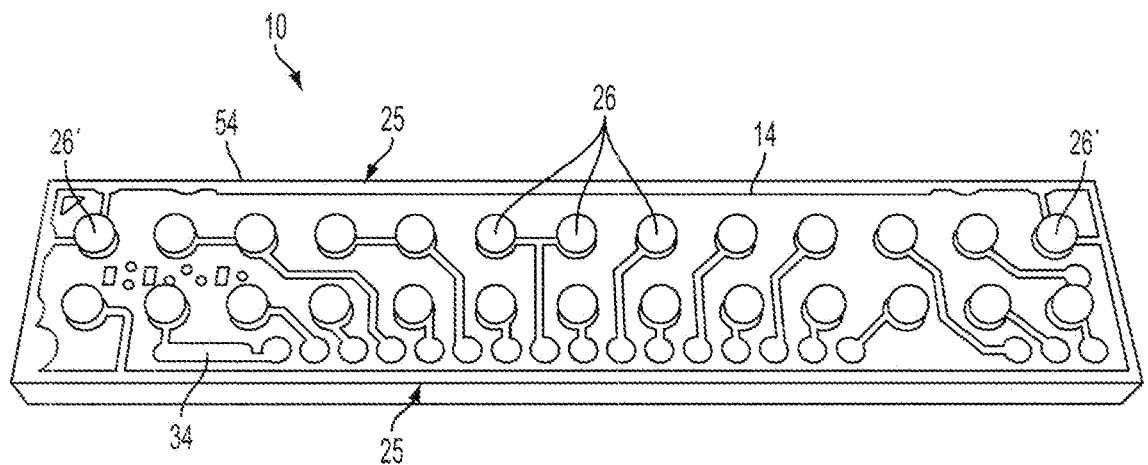
FIG. 3 is a top perspective view of a connection side of the fingerprint sensor package of FIG. 1.
Figure 4:
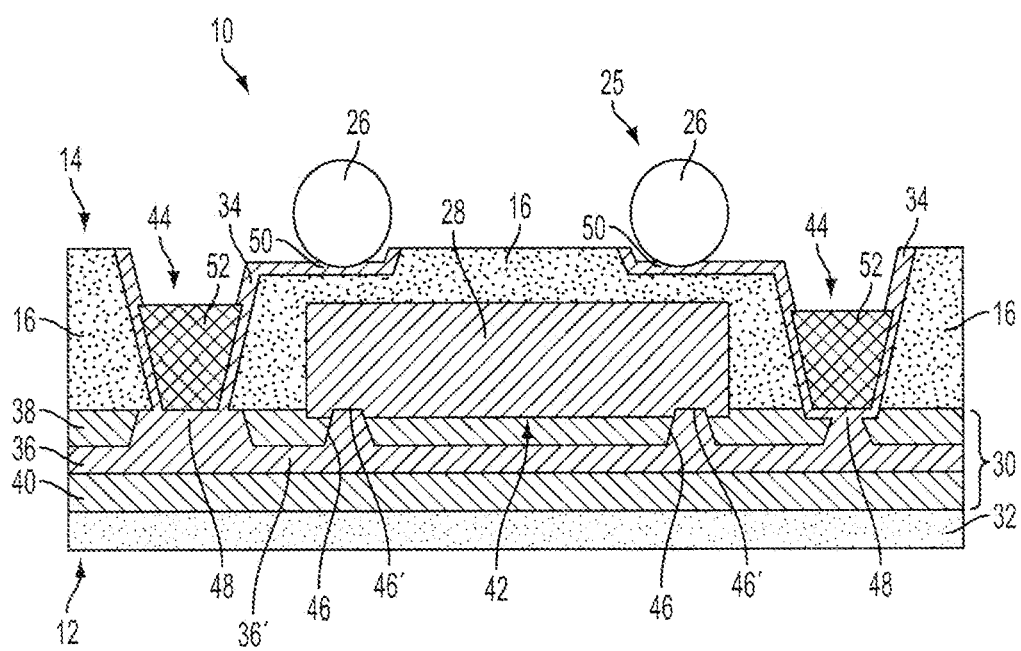
FIG. 4 is a cross-sectional view of the fingerprint sensor package of FIG. 1.
Figure 5:
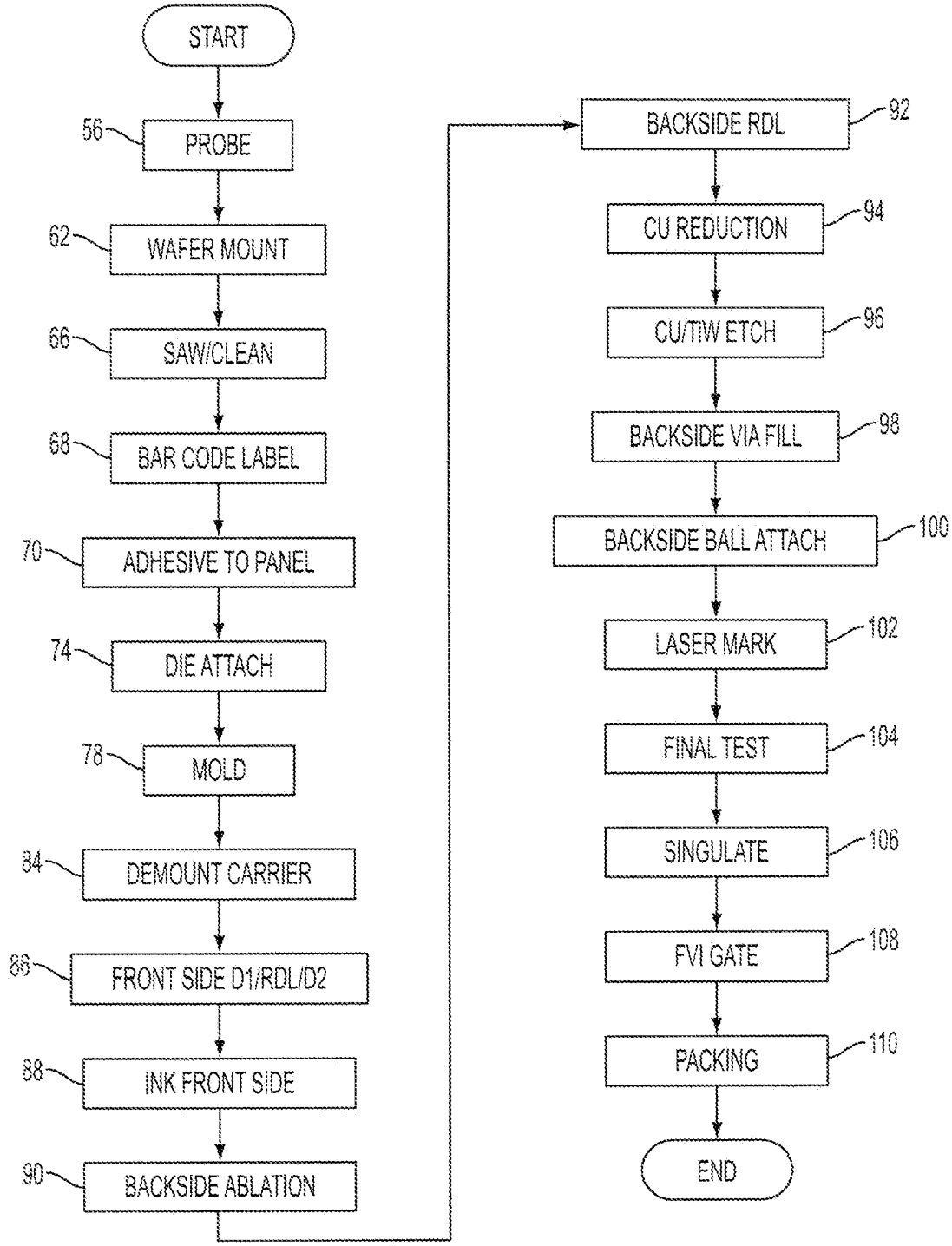
FIG. 5 is a flow chart of a process for fabricating fingerprint sensor packages.

As shown in FIGS. 1-3, the connection side 14 can include a ball grid array ("BGA") 25, comprising a plurality of solder balls 26 to electrically couple the connection side 14 to the device substrate 20. In addition, as shown in FIG. 4, the fingerprint sensor package 10 can include a sensor integrated circuit 28, a sensing side redistribution layer 30, a sensing side coating or ink layer 32, and a connection side redistribution layer 34.

In at least some aspects, the sensing side redistribution layer 30 can include a metal layer 36 with metal redistribution traces 36', a metal sensor array (not shown), and, optionally, additional metal traces (not shown). The metal layer 36 can be positioned between a first passivation layer 38 and a second passivation layer 40, as shown in FIG. 4. The sensor array (not shown) can include a plurality of conductive traces (not shown), such as copper traces, for providing image sensing to detect the ridges and valleys of a fingerprint as a finger moves across the sensing side 12 and/or velocity sensing to detect the speed of a finger moving across the sensing side 12, as is shown by way of example in the Benkley references cited above.

Fingerprint information sensed by the sensor array (not shown) can be transmitted to the sensor integrated circuit 28 via wireless or wired communication technologies. For example, in one aspect, a circuit side 42 of the sensor integrated circuit 28 (e.g., the side facing the sensing side 12) can include a radio frequency receiver (not shown) and each trace of the sensor array (not shown) can include a radio frequency transmitter (not shown) for transmitting the sensed fingerprint information to the radio frequency receiver (not shown). In other aspects, the sensor integrated circuit 28 can include a plurality of radiofrequency receivers (not shown), e.g., formed on the sensor side 42 of the integrated circuit 28, for receiving information transmitted from one or more of the radio frequency transmitter traces (not shown) of the sensor array (not shown), e.g., also formed on the sensor side 42 of the integrated circuit 28. The sensor integrated circuit 28 can also include drive and sense electronics for interpreting the fingerprint information received. In addition, the sensing side coating layer 32 can provide substantial protection against mechanical abrasion and/or mechanical wear of the sensor integrated circuit 28 and the sensing side redistribution layer 30, while such traces as may be formed on the sensor side 42 of the integrated circuit 28 can be similarly protected by layers 30 and 32.

In other aspects, the circuitry on the sensor side 42 of the sensor integrated circuit 28 can include an embedded pixel array (not shown) for directly sensing fingerprint information. In one example, the embedded pixel array (not shown) can sense fingerprint information through the sensing side redistribution layer 30 and/or the sensing side coating layer 32. In another example, the embedded pixel array (not shown) can be substantially exposed on the sensing side 12 so that the finger directly touches the sensor integrated circuit 28 for sensing, e.g., through an opening formed in the layers 30 and 32. The sensor integrated circuit 28 can also include the drive and sense electronics for interpreting the fingerprint information sensed by the pixel array (not shown).

The mold filler 16 can provide the fingerprint sensor package 10 with substantial strength and durability, and can substantially protect the sensor integrated circuit 28 from physical damage. As shown in FIG. 4, the mold filler 16 can include through-mold vias ("TMVs") 44 which extend through the mold filler 16. The TMV vias 44 can allow connection between the sensing side redistribution layer 30 and the connection side redistribution layer 34. More specifically, the sensing side redistribution layer 30 can have redistribution connections 46 from the sensor/circuit side 42 of the sensor integrated circuit 28, such as bond pad connections 46', also shown in an embodiment of FIG. 18, to peripheral connection locations 48 at the vias 44. The connection side redistribution layer 34 can redistribute from the connection locations 48, through the TMV vias 44, to BGA 25 individual solder balls 26, e.g., attached at connection points 50. As a result, the connections 46 from the sensor integrated circuit 28 can be electrically routed to the BGA 25 solder ball connectors 26 on the connection side 14 by the redistribution layers 30, 34. Fingerprint information received and interpreted by the sensor integrated circuit 28 can then be communicated to the device 18 through the BGA 25 to the device substrate 20 (shown in FIG. 1 by way of example). In conventional fingerprint sensor packages, encapsulated wire bonds (not shown) can be routed from a sensing side 12 around the sensor integrated circuit 28 to a connection side 14. In some aspects, the TMV vias 44 replace encapsulated wire bond connections (not shown), which can substantially decrease the thickness and/or area of the fingerprint sensor package 10 compared to conventional fingerprint sensor packages. Also, as shown in FIG. 4, the TMV vias 44 can be filled with a filler material 52, for example, to add further structural strength and rigidity to the package 10.

Conventional electronic components, such as integrated circuits 28 in fingerprint sensor packages 10, can be exposed to electrostatic discharge (ESD) from various different sources, such as the human body (e.g., during a finger swipe). Contact between the sources and a grounded integrated circuit can generate large enough currents through the integrated circuit to cause significant damage. As shown in FIG. 3, the fingerprint sensor package 10 can include ESD discharge traces 54 etched or otherwise formed, as described below, at least partially around a perimeter of the connection side 14. The ESD discharge traces 54 can be connected to a known potential, such as ground. For example, as shown in FIG. 3, the ESD discharge traces 54 can be connected to respective solder balls 26' in the BGA 25 for connection to a known potential through the substrate 20 of the host product or device 18.

ESD can build up on the sensing side 12 as a user swipes his or her finger. This charge can continue to increase in potential until the path of least resistance is found and the charge is dissipated. The ESD discharge traces 54 can create the shortest discharge path for ESD, thus preventing ESD from discharging to the sensor integrated circuit 28 or any other components of the fingerprint sensing package 10 and potentially damaging them. In some aspects, the ESD discharge traces 54 can completely surround the outside perimeter of the connection side 14. In other aspects, the ESD discharge traces 54 can partially surround the outside perimeter of the connection side 14. Also, in some aspects, the ESD discharge traces 54 can be positioned on the sensing side 12 to completely or at least partially surround the sensor array (not shown).

Figure 6:
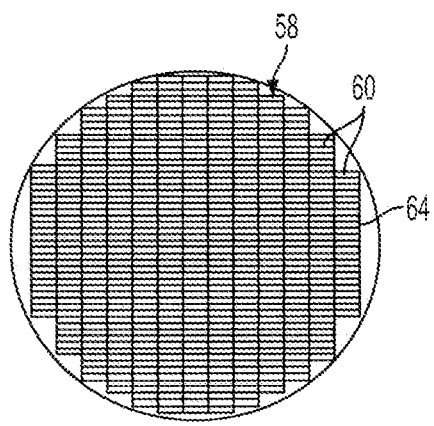
FIG. 6 is a top view of a silicon wafer according to one step of the process of FIG. 5.
Figure 7:
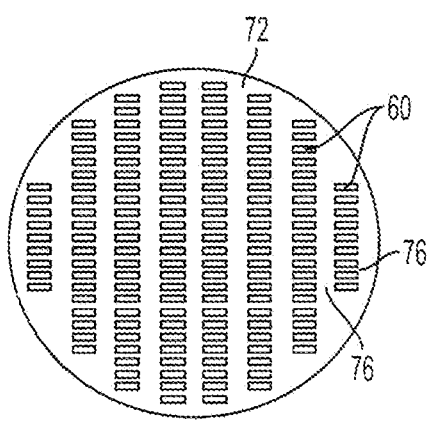
FIG. 7 is a top view of redistributed silicon die according to another step of the process of FIG. 5.
Figure 8:
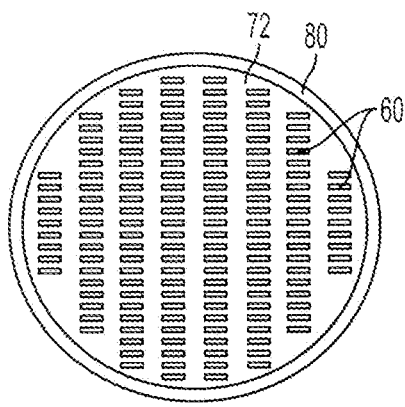
FIG. 8 is a top view of the redistributed silicon die according to another step of the process of FIG. 5.
Figure 9:
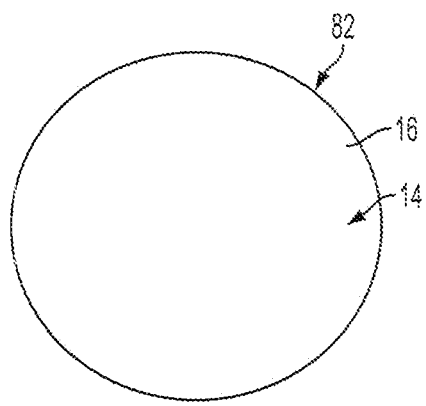
FIG. 9 is a top view of the redistributed silicon die according to another step of the process of FIG. 5.

FIGS. 5-12 illustrate a wafer-level fan out ("WLFO") process for fabricating the fingerprint sensor package 10 according to an aspect of the disclosed subject matter. First, as shown in FIG. 6, at step 56, a silicon wafer 58 containing a plurality of die 60 (i.e., forming electronic circuitry such as the sensor integrated circuits 28 of FIGS. 1, 2 and 4) can be probed to test the functionality of each die 60. At step 62, the silicon wafer 58 can be mounted onto a film 64, which provides support during sawing of the die 60. At step 66, the die 60 can be sawed apart and cleaned and, at step 68, each die 60 can be marked (e.g., with a bar code label, not shown) for identification purposes. At step 70, an adhesive can be applied to a sticky tape 72 or similar product for receiving the separated die 60. At step 74, separate die 60 can be redistributed onto the sticky tape 72 with sufficient spacing 76 between each die 60, as shown in FIG. 7. At step 78, a mold ring 80 can be placed around the sticky tape 72, as shown in FIG. 8, and the mold filler 16 can be filled around and over the redistributed die 60 to create a new wafer 82 of partially-constructed packages, as shown in FIG. 9. The mold filler 16 can be added at a height or thickness to completely cover the die 60, i.e., rendering them not visible from the side of the molded wafer 82 shown in FIG. 9. For example, in one aspect, the mold filler 16 can have a height or thickness of between about 700 micrometers and about 800 micrometers. At step 84, the new wafer 82 can be demounted from the sticky tape 72, i.e., exposing the die 60 on the opposite side from that shown in FIG. 9.

Figure 10:
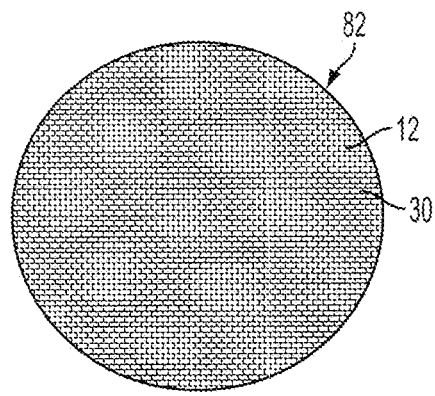
FIG. 10 is a bottom view of the redistributed silicon die according to another step of the process of FIG. 5.
Figure 11:
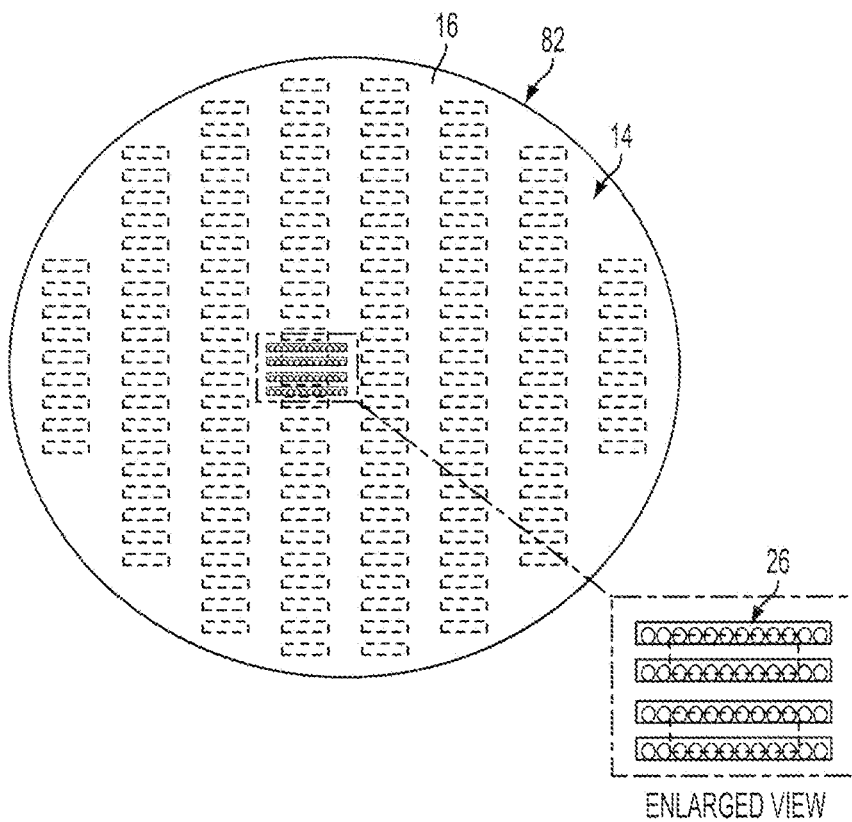
FIG. 11 is a partly enlarged bottom view of the redistributed silicon die according to another step of the process of FIG. 5.

At steps 86 and 88, the new wafer 82 can be turned over for processing of layers on the sensing side 12, as shown in FIG. 10. More specifically, at step 86, the sensing side redistribution layer 30, as described above, can be applied to the sensing side 12. The sensing side redistribution layer 30 can include a metal layer 36 positioned between a first passivation layer 38 and a second passivation layer 40, as described above. The metal layer 36 can provide for electrical connections 46 on each die 60, such as bond pads, to connection locations 48 beside, or around, each die 60 (e.g., within the spacing 76 in the mold filler 16 between the die 60). The metal layer 36 can also provide the sensor array (not shown) for providing the image sensor drive and pick-up connections and/or the velocity sensor drive and pick-up connections, as appropriate. In some aspects, the sensing side redistribution layer 30 can substantially cover the entire circuit side 42 of the sensor integrated circuit 28. In other aspects, the sensing side redistribution layer 30 can provide an opening to expose the embedded pixel array on the sensor integrated circuit 28. At step 88, the entire sensing surface 12 of the new wafer 82, including the sensing side redistribution layer 30, can be coated with the sensing side coating layer 32, which can be ink or another suitable hard coating material. In some aspects, the embedded pixel array (not shown) can also be coated by the sensing side coating layer 32. In other aspects, the embedded pixel array (not shown) can remain exposed.

In some aspects, the sensing side redistribution layer 30 can have a thickness between about 22.5 micrometers and about 31 micrometers. For example, the first passivation layer 38, e.g., formed of a dielectric, such as, amorphous silicon dioxide ("$SiO_2$"), can have a thickness of about 11 micrometers, the metal layer 36 can have a thickness of about 9 micrometers, and the second passivation layer 40, e.g., also of $SiO_2$ can have a thickness of about 11 micrometers. In addition, in some aspects, the sensing side coating layer 32 can have a thickness of between about 15 micrometers and 25 micrometers. In some aspects, the thickness of the second passivation layer 40 and the sensing side coating layer 32 may be thin enough to allow sufficient sensing of fingerprint information by the sensor array (not shown), which may be formed, e.g., in the metal layer 36 or on the sensor side 42 of the integrated circuit 28.

Following processing of the sensing side 12, the new wafer 82 can be turned over for processing of the connection side 14. At step 90, the mold filler 16 can be laser ablated from the connection side 14 to create vias 44 in line with the electrical redistribution connection locations 48 on the sensing side 12. At step 92, the connection side redistribution layer 34 can be applied to the connection side 14 including, at step 94, applying a copper layer 34 to the connection side 14 and, at step 96, etching the copper to provide routing connections, e.g., from the vias 44 to BGA 25 connection points 50. Also, at step 96, etching of the copper can provide electrostatic discharge traces 54, as described above, between the die 60. At step 98, the vias 44 can be filled with a filler material 52 and at step 100, the BGA 25 solder balls 26 can be attached at the BGA 25 connection points 50, as shown, e.g., in FIGS. 4 and 11.

Figure 12:
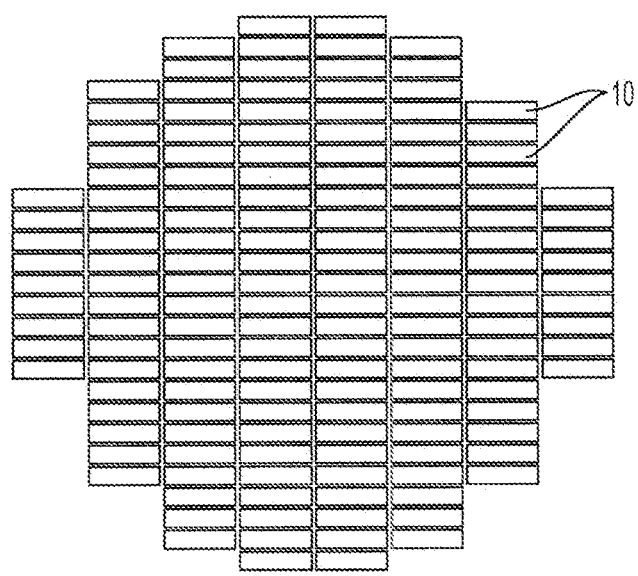
FIG. 12 is a top view of a plurality of separated fingerprint sensor packages according to another step of the process of FIG. 5.

Following attachment of the BGA 25 solder balls 26, the packages can be laser marked (e.g., on the connection side 14) at step 102 with additional identification information. At step 104, final testing can be performed on the packages. At step 106, individual fingerprint sensor packages 10 can be separated, as shown in FIG. 12, followed by a final visual inspection at step 108 and packing for shipment at step 110.

In some aspects, the fingerprint sensor package 10, as shown in FIGS. 1-4, can have a length of about 11 millimeters and a width of about 2.5 millimeters. The area of the sensor array on the sensing side 12 can be about 20 micrometers by about 100 micrometers, or less, in some aspects. The length and the width of the fingerprint sensor package 10 can be substantially smaller than conventional fingerprint sensor packages, which can permit a smaller opening 22 within the housing 24 of the host device 18 for the fingerprint sensor package 10. In addition, the connection side 14 of the fingerprint sensor package 10 can be surface mounted to the substrate 20 of the device 18 directly below the opening 22. As a result, the fingerprint sensor package 10 can take up less space compared to conventional fingerprint sensor packages which may require additional space on the underside of the housing 24 for connection to the device substrate 20.

Figure 13:
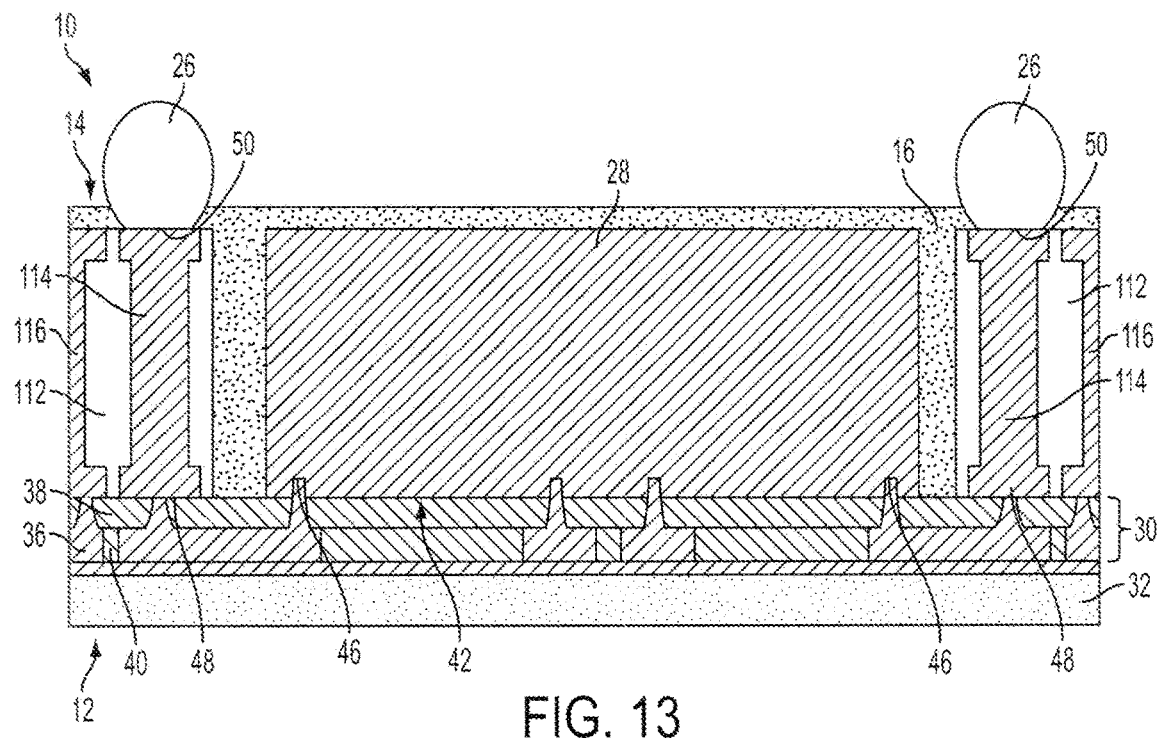
FIG. 13 is a cross-sectional view of another embodiment of a fingerprint sensor package.
Figure 14:
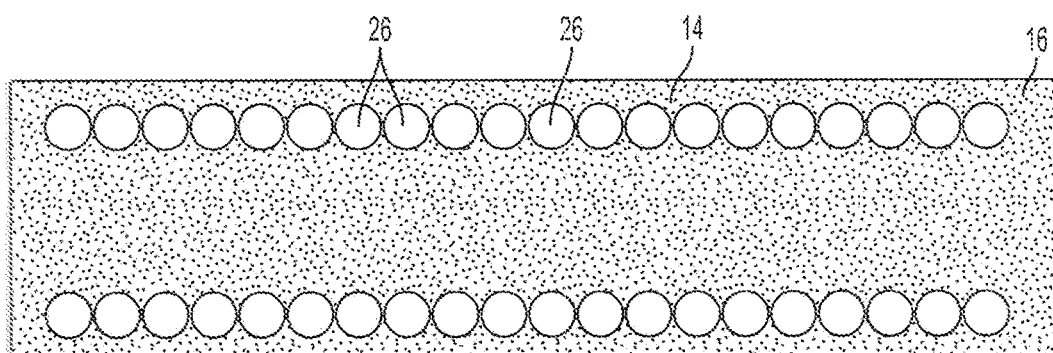
FIG. 14 is a bottom view of a connection side of an isolated fingerprint sensor package of FIGS. 11-13.

FIGS. 13-17B illustrate the fingerprint sensor package 10 according to another embodiment of the disclosed subject matter. As shown in FIG. 13, the fingerprint sensor package 10 can include a sensor integrated circuit 28, mold filler material 16, a sensing side electrical redistribution layer 30, a sensing side coating layer 32, and a BGA 25, with solder balls 26. The fingerprint sensor package 10 can also include interposer boards 112 on either side of the sensor integrated circuit 28. The interposer boards 112 can include plated and/or metal-filled vias 114. On the sensing side 12, the sensing side redistribution layer 30 can electrically connect the connections 46 of the sensor integrated circuit 28 with connections 48 for the vias 114. In one embodiment, on the connection side 14, the BGA 25 solder balls 26 can be attached directly to connection points 50 on each of the vias 114, as shown in FIGS. 13 and 14. In another embodiment, the BGA 25 solder balls 26 can be connected to the vias 114 through a connection side redistribution layer (not shown).

As shown in FIG. 13, the fingerprint sensor package 10 can also include ESD discharge castellations 116 (e.g., partial vias). The ESD discharge castellations 116 can at least partially surround the outer edges of the fingerprint sensor package 10 and can be electrically connected to a known potential, such as ground, in order to provide a dissipation pathway for ESD and to protect the sensor integrated circuit 28. In some aspects, the ESD discharge castellations 116 can be formed from the vias 114 on the interposer boards 112 which are substantially split in half, as described below.

Figure 15:
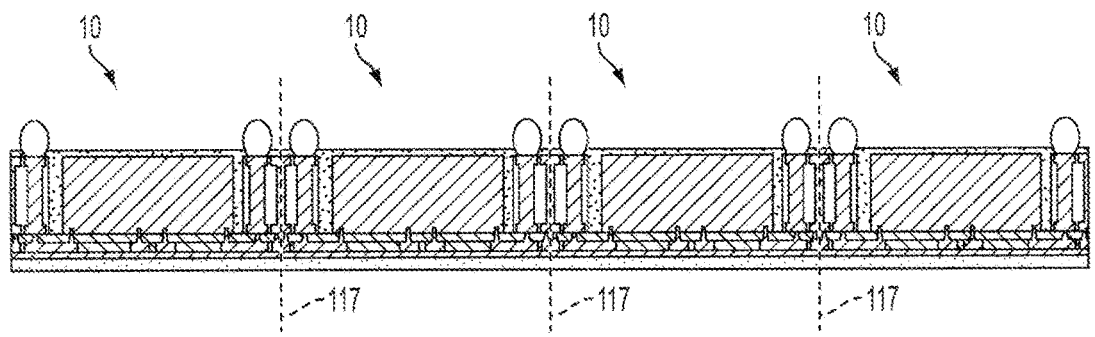
FIG. 15 is a cross-sectional view of a plurality of fingerprint sensor packages of FIG. 13 prior to separation.

As shown in FIG. 15, multiple fingerprint sensor packages 10 can be fabricated in wafer form and then sawed apart (e.g., along saw lines 117). For example, in one embodiment, the fingerprint sensor packages 10 can be fabricated according to the following method.

Figure 16:
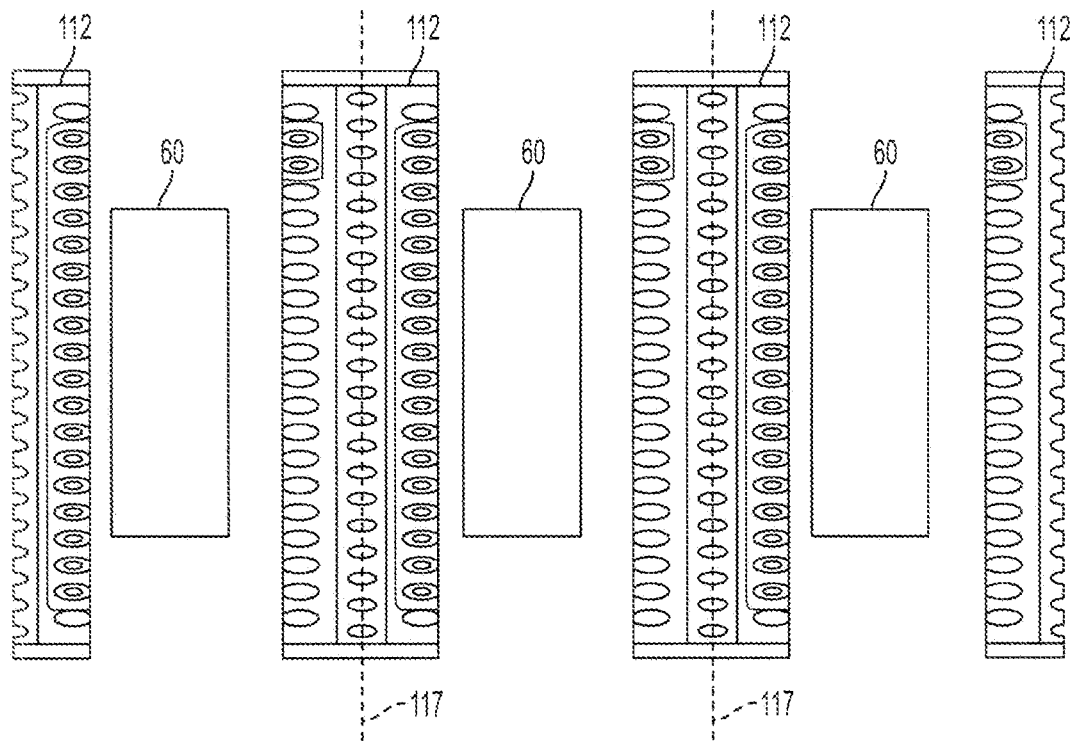
FIG. 16 is an exploded view of redistributed silicon die and interposer boards prior to separation during fabrication of the fingerprint sensor packages of FIGS. 13-15.
Figure 17A:
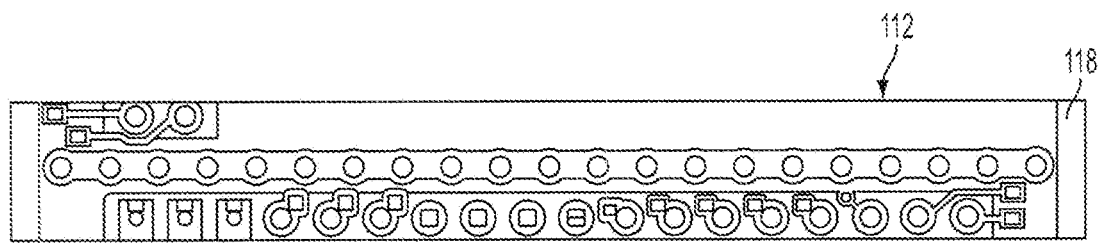
FIG. 17A is a top view of a sensing side of an interposer board of the fingerprint sensor package of FIGS. 13-15.
Figure 17B:
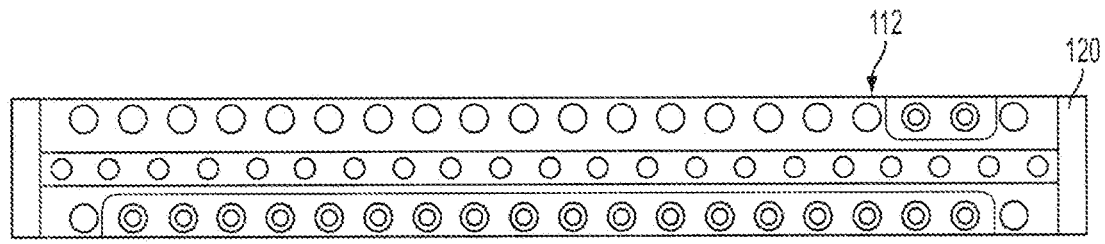
FIG. 17B is a bottom view of a connection side of the interposer board of the fingerprint sensor package of FIGS. 13-15.

A silicon wafer including a plurality of die 60 (i.e., sensor integrated circuits 28) can be sawed apart and the die 60 can be distributed on a sticky tape or similar material so that the circuit side 42 of the die 60 are attached to the sticky tape. Also, a panel of interposer boards 112 can be split apart and the individual interposer boards 112 can be distributed onto the sticky tape in between the die, for example in the orientation shown in FIG. 16. FIG. 17A illustrates an example sensing side 118 of the interposer boards 112 which can be applied to the sticky tape, and later electrically connected to the die 60, as described below. FIG. 17B illustrates an example connection side 120 of the interposer boards 112, which can later be connected to BGA 25 solder balls 26, as described below.

After the die 60 and the interposer boards 112 are distributed onto the sticky tape, the mold filler 16 can be applied to substantially cover and fill between the die 60 and the interposer boards 112, substantially fixing the die 60 and the interposer boards 112 in place in relation to one another and creating a new wafer. The sticky tape can be removed and a sensing side redistribution layer 30 can be applied to the sensing side 12 of the new wafer. The sensing side redistribution layer 30 can electrically connect the die 60 and the interposer boards 112, as described above. The sensing side redistribution layer 30 can also include the metal sensor array (not shown) including the image sensor drivers and pick-ups (not shown) and/or the velocity sensor drivers and pick-ups (not shown). The sensing side redistribution layer 30 can be coated, for example with a sensing side coating layer 32. The connection side 14 of the new wafer can be laser ablated to expose BGA 25 solder ball 26 connection points 50 on the interposer boards 112 and the BGA 25 solder balls 26 can then be applied to the BGA 25 solder ball 26 connection points 50. The new wafer can then be sawed apart at the saw lines 117, as shown in FIGS. 15 and 16, substantially splitting each of the interposer boards 112 to separate individual fingerprint sensor packages 10 and to expose the ESD discharge castellations 116 along at least some of the outer side walls of each of fingerprint sensor packages 10. Metal layers can also be added on the other side walls.

In one embodiment, the fingerprint sensor package 10, as shown in FIGS. 13-17B, can have a thickness of about 1.1 millimeters. For example, the sensing side coating layer 32 can be about 25 micrometers thick, the sensing side redistribution layer 30 can be about 22.5 micrometers thick, the mold filler 16 can be about 800 micrometers thick (e.g., to substantially cover the sensor integrated circuit 28, which can be about 620 micrometers in thickness), and the BGA 25 solder balls 26 height can be about 250 micrometers. In addition, in some aspects, the fingerprint sensor package 10, as shown in FIGS. 13-17B, can have a length less than about 12 millimeters and a width less than about 3 millimeters. The area of the sensor array (not shown) on the sensing side 12 can be about 20 micrometers by about 5 micrometers, or less in some aspects.

Figure 18:
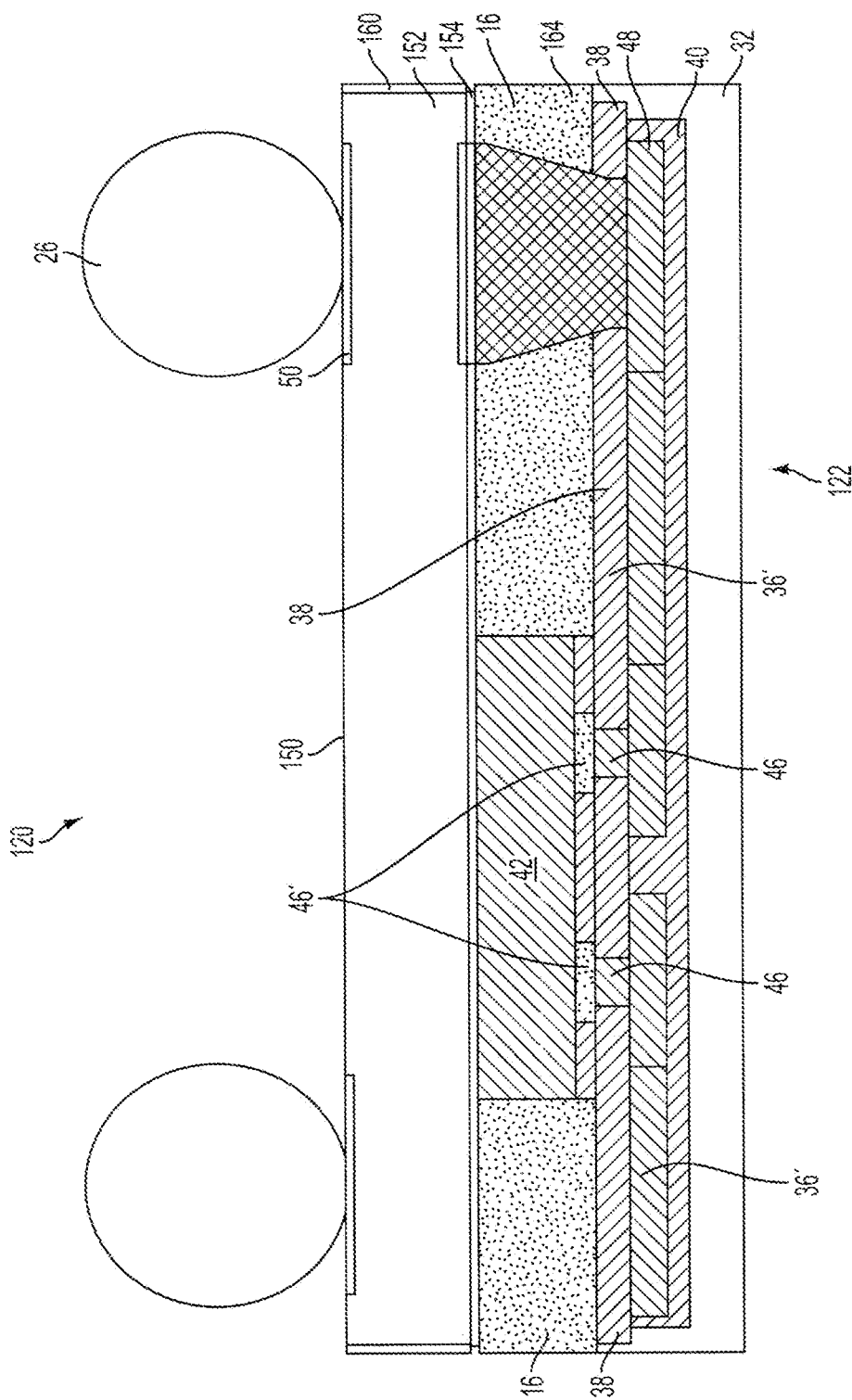
FIG. 18 is a cross-sectional view of an additional possible embodiment of the disclosed subject matter.
Figure 19:
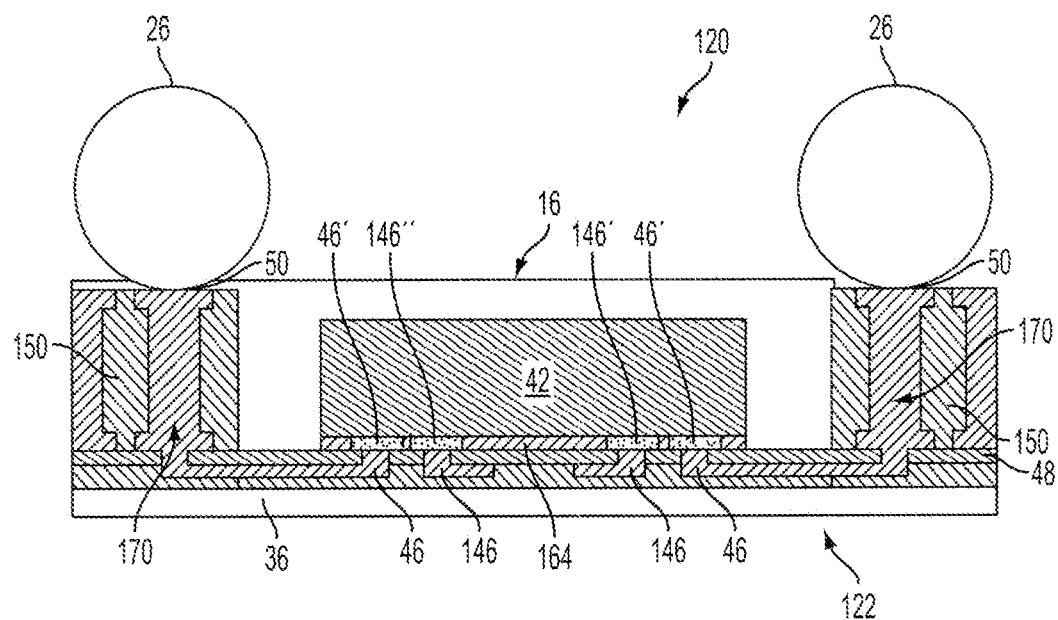
FIG. 19 is a cross-sectional view of an additional possible embodiment of the disclosed subject matter.
Figure 20:
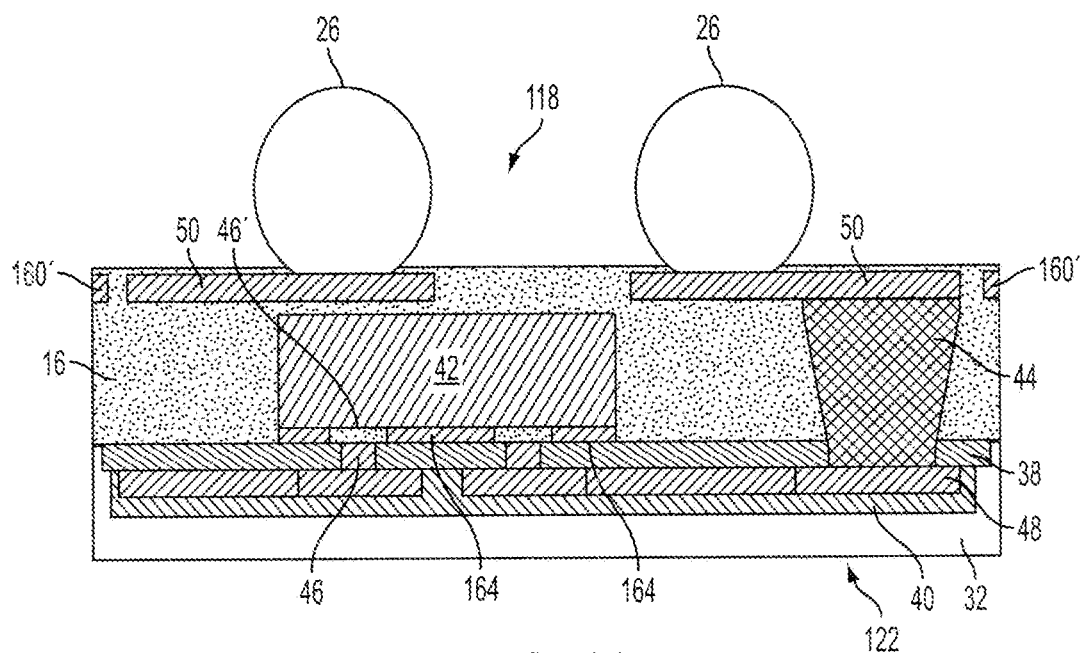
FIG. 20 is a cross-sectional view of an additional possible embodiment of the disclosed subject matter.

Turning now to FIGS. 18-20 there are shown cross sectional views of other possible embodiments of the disclosed subject matter. Another embodiment of the sensor package 10, as illustrated by way of example in FIG. 18 can have the connection side 14 including a multilayer printed circuit board ("MLPCB") 150. The MLPCB 150 may have mounted on it solder balls 26 forming the ball grid array 25, mounted on solder ball connection pads 50. The solder ball connection pads 50 can be connected electrically to the metal layers in the sensing side 14 of the fingerprint sensor WLFO package through TMV vias 44 formed in the fill material 16, and internal vias in the PCB 150 (not shown). The TMV vias 44 may be connected to electrical connectors 50 on the PCB 150 through solder 152 and the PCB 150 may be connected to the WLFO package through a layer of adhesive 154. FIGS. 18-20 also illustrate metal pad 46' connecting the vias 46 to the silicon of the IC device 42. FIGS. 18-20 also illustrate a SiPO dielectric layer 164. The WLFO package of FIG. 19 has the fill material 16 in an opening in a PCB layer 150, such that the fill material 16 surrounds and encapsulates the IC die 42. Also through vias 170 in the PCB layer material, filled with conducting material can provide electrical connection between the solder ball mounting plates 50 and the metal layers on the sensing side 12 of the package 10. FIG. 19 also illustrates an example of sensor traces 146 connected to metal pads 146,' e.g., forming the drive plates and pick-up plates of the sensor devices. The WLFO package of FIG. 20 illustrates the fill layer 16 extending all the way to the outer surface of the connection side, except for ball metal traces 50 and vias 44. and an ECD ring 160'.

If a package constructed using a supporting filler, such as a wafer level fan out ("WLFO") construction technique, and uses through is made with through-mold vias ("TMVs") formed through the molded filler material, the package can be made much thinner. It is, also, much easier to do the TMV, if the WLFO is connected to a multilayer printed circuit board "PCB". Multilayer PCBs are relatively cheap, and can also be used to adjust the height of the package very easily. A connection to a common reference voltage, e.g., a grounded connection "EGND" 160 could be placed around the edge of the PCB 150, as seen, e.g., in FIG. 18 or 160' around the bottom lip, as seen, e.g., in FIG. 20, for ESD protection. The WLFO with TMV can be connected to the PCB 150 portion of the package 10 with solder 152 and adhesive 154 (e.g., seen in FIG. 18). Cost could be reduced from a thicker WLFO plus TMV package, e.g. as seen in FIGS. 19 and 20, because the thickness of the WLFO with TMV can then be greatly reduced. This can also reduce the amount of time required for the TMV laser ablation formation process.

Figure 21:
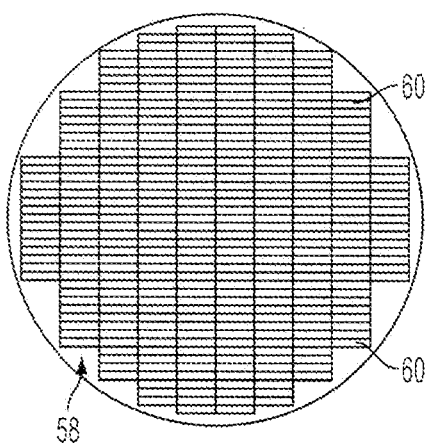
FIG. 21 shows a wafer populated with a plurality of die forming a plurality of main fingerprint imaging sensor circuitry integrated circuits.
Figure 22:
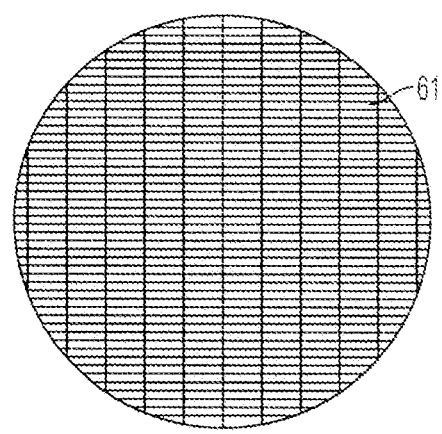
FIG. 22 shows a secondary IC, such as containing micro-metalizations forming, e.g., biometric object sensing elements like capacitive coupled drivers and pick-ups or electronic circuits, such as like light emitting diodes ("LEDS") according to aspects of the disclosed subject matter.
Figure 23:
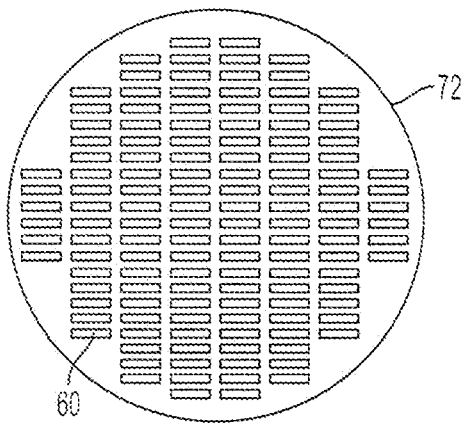
FIG. 23 shows an example of redistribution of the fingerprint sensor into a co-molded wafer ("CMW") according to aspects of embodiments of the disclosed subject matter.
Figure 24:
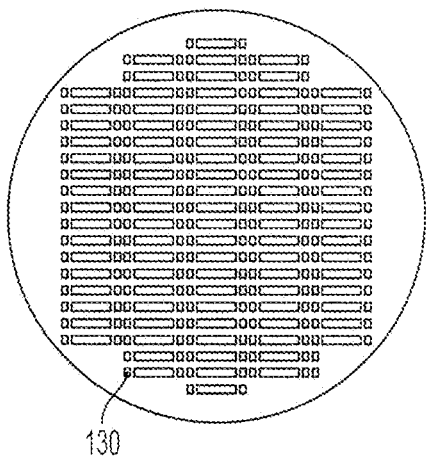
FIG. 24 illustrates redistribution of fingerprint sensor ICs and secondary ICs into a co-molded wafer ("CMW") according to aspects of embodiments of the disclosed subject matter.
Figure 25:
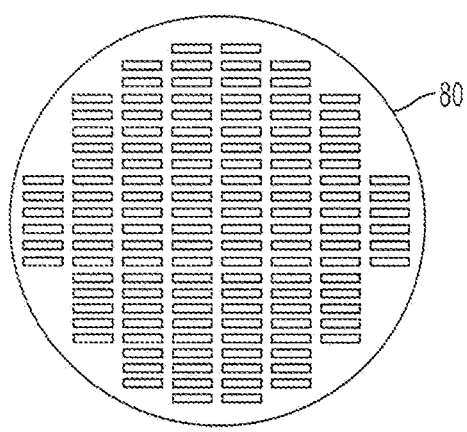
FIG. 25 illustrates the placement of a mold ring around the CMW according to aspects of embodiments of the disclosed subject matter.
Figure 26:
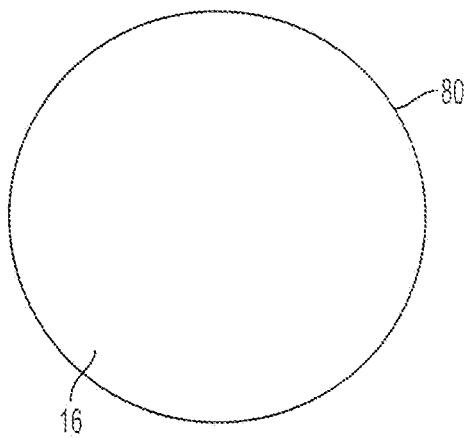
FIG. 26 shows an example of the injection of fill material to further form the CMW according to aspects of embodiments of the disclosed subject matter.
Figure 27:
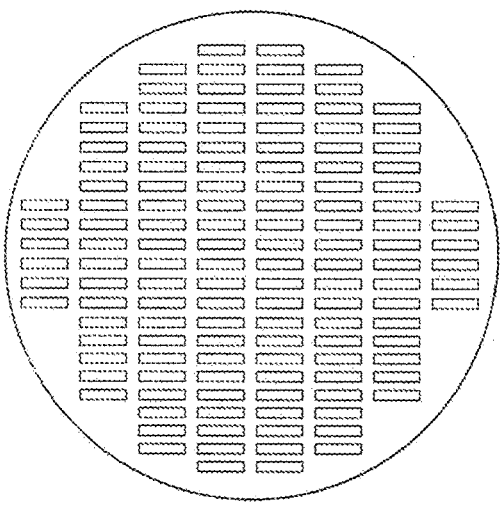
FIG. 27 illustrates a top view of the CMW prior to the application electrical redistribution layers according to aspects of embodiments of the disclosed subject matter.
Figure 28:
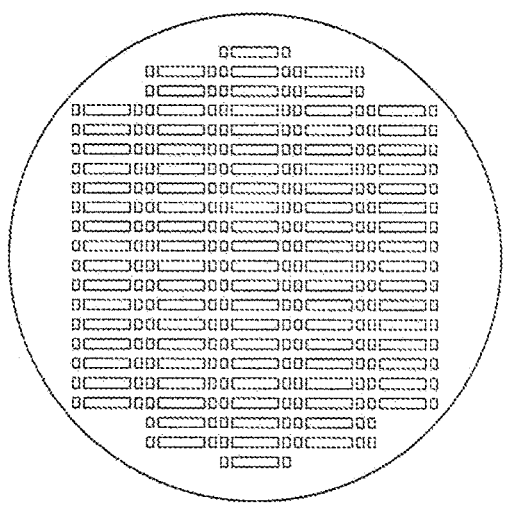
FIG. 28 also illustrates a top view of CMW prior to RDL layers being applied, according to aspects of embodiments of the disclosed subject matter.
Figure 29:
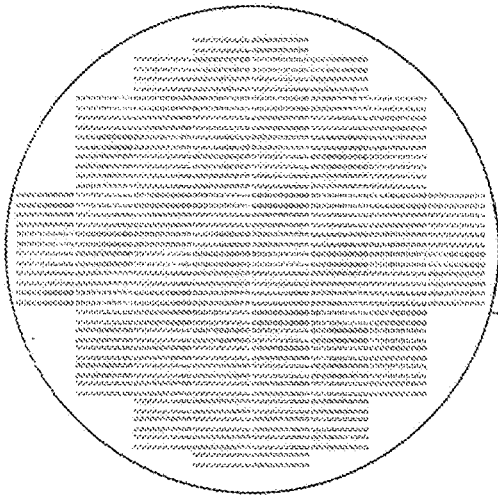
FIG. 29 illustrates the placement of solder balls on the CMW according to aspects of embodiments of the disclosed subject matter.
Figure 30:
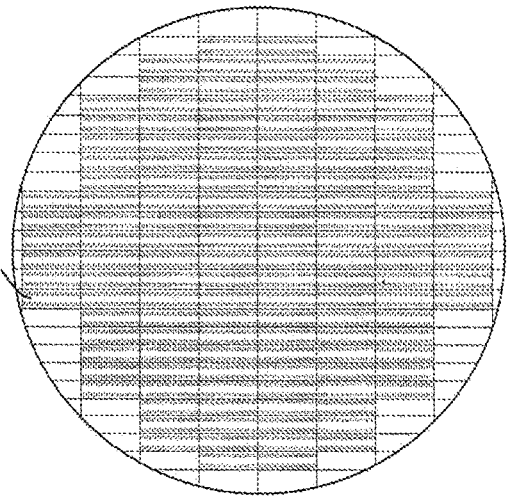
FIG. 30 illustrates a top view of the sawing apart of CMWs into individual WLFO packaged devices.
Figure 31:
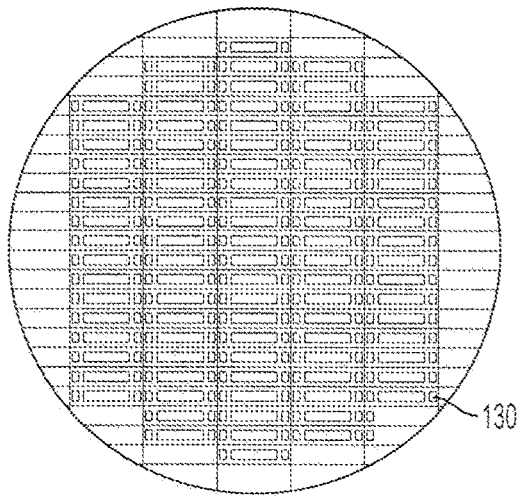
FIG. 31 illustrates a bottom view of the sawing of the CMW into individual WLFO packaged devices.

FIG. 21 shows a wafer 58 populated with a plurality of die 60 forming a plurality of main fingerprint imaging sensor circuitry integrated circuits. FIG. 22 shows a wafer of secondary ICs 61, such as, containing electronic circuits, such as light emitting diodes ("LEDS") 130, or other items utilized with or ancillary to or complimentary of the actual biometric object sensor controller IC 42, and to be contained in the same package, e.g., formed within the molded filler material 16 along with the IC 42, according to aspects of the disclosed subject matter. FIG. 23 shows an example of redistribution of the finger print sensor into a co-molded wafer ("CMW") 72 according to aspects of embodiments of the disclosed subject matter. FIG. 24 illustrates redistribution of fingerprint sensor ICs and secondary ICs into a co-molded wafer ("CMW") 72 according to aspects of embodiments of the disclosed subject matter. FIG. 25 illustrates the placement of a mold ring 80 around the CMW 72 according to aspects of embodiments of the disclosed subject matter. FIG. 26 shows an example of the injection of fill material 16 to further form the CMW 72 according to aspects of embodiments of the disclosed subject matter. FIG. 27 illustrates a top view of the CMW 72 prior to the application electrical redistribution layers. FIG. 28 also illustrates a top view of CMW prior to RDL layers being applied, according to aspects of embodiments of the disclosed subject matter. FIG. 29 illustrates the placement of solder balls 26 on the CMW 72 to form ball grid arrays 25, according to aspects of embodiments of the disclosed subject matter. FIG. 30 illustrates the sawing apart of CMWs 72 into individual WLFO packaged devices 10. FIG. 31 also illustrates the sawing of the CMW into individual WLFO packaged devices.

While preferred embodiments of the present disclosed subject matter have been shown and described herein, it will be obvious to those skilled in the art that such embodiments are provided by way of example only. Numerous variations, changes, and substitutions will now occur to those skilled in the art without departing from the disclosed subject matter. It should be understood that various alternatives to the embodiments of the disclosed subject matter described herein may be employed in practicing the disclosed subject matter. It is intended that the following claims define the scope of the disclosed subject matter and that methods and structures within the scope of these claims and their equivalents be covered thereby.

What is claimed is:

1. A sensor device comprising:
   a sensor die comprising:
      a die top side comprising circuitry, the die top side facing an upward vertical direction;
      a die bottom side facing a downward vertical direction; and
      a plurality of die lateral sides between the die top side and the die bottom side;
   a sensing area on the die top side;
   a top side conductor, where at least a portion of the top side conductor is above the die top side;
   a bottom side connection point;

a conductive via that electrically connects the top side conductor to the bottom side connection point, where the conductive via is laterally displaced from the sensor die; and an encapsulant that covers at least the die lateral sides.

2. The sensor device of claim 1, wherein the bottom side connection point comprises a solder ball connection point that is separated from the sensor die and is vertically at least as low as the die bottom side.

3. The sensor device of claim 1, comprising a protective material that covers the sensing area and is configured to allow fingerprint sensing through the protective material, and wherein the protective material covers an entirety of the top die side.

4. The sensor device of claim 1, comprising:
a protective material that covers the sensing area; and
an intervening dielectric material, and wherein an entirety of the protective material is separated from the die top side by at least the intervening dielectric material, and
wherein the sensor device is configured to sense fingerprints through the protective material and the intervening dielectric material.

5. The sensor device of claim 1, wherein:
an entirety of the conductive via is laterally displaced from the sensor die; and
at least a portion of the conductive via is directly laterally displaced from the sensor die.

6. The sensor device of claim 1, wherein the sensing area is vertically lower than the top side conductor.

7. The sensor device of claim 1, wherein:
the top side conductor comprises a metal redistribution layer; and
the encapsulant covers an entirety of the die bottom side.

8. The sensor device of claim 1, wherein:
the encapsulant covers an entirety of the die bottom side; and
a top side of the encapsulant is substantially coplanar with the die top side.

9. The sensor device of claim 1, comprising a conductive ball coupled to the bottom side connection point, where at least a portion of the conductive ball is embedded in the encapsulant.

10. The sensor device of claim 1, wherein the sensing area is directly on the die top side.

11. A sensor device comprising:
a sensor die comprising:
a die top side facing an upward vertical direction;
a die bottom side facing a downward vertical direction; and
a plurality of die lateral sides between the die top side and the die bottom side;
a sensing area on the die top side;
a top side conductor, where at least a portion of the top side conductor is above the die top side;
a bottom side connection point that is lower than the die bottom side;
a first interposer positioned laterally in relation to the sensor die, wherein:
the first interposer comprises a first interposer board that comprises a conductive via, the conductive via electrically connecting the top side conductor to the bottom side connection point;
at least a portion of the conductive via is positioned directly laterally from the sensor die; and
the first interposer board comprises an interior lateral surface that faces directly toward the sensor die; and an encapsulant that covers at least the die lateral sides and contacts the interior lateral surface of the first interposer board.

12. The sensor device of claim 11, wherein the conductive via spans an entirety of a vertical height of the sensor die.

13. A sensor device comprising:
a sensor die having a die top side, a die bottom side, and die lateral sides;
a sensing area on the die top side;
a top side conductor, where at least a portion of the top side conductor is above the die top side;
a bottom side connection point;
a first interposer positioned laterally in relation to the sensor die, wherein:
the first interposer comprises a conductive via that electrically connects the top side conductor to the bottom side connection point; and
at least a portion of the conductive via is positioned directly laterally from the sensor die;
an encapsulant that covers at least the die lateral sides; and
a second interposer positioned laterally in relation to the sensor die and positioned such that the sensor die is laterally between the first interposer and the second interposer, and wherein:
the first interposer laterally covers a first die lateral side of the die lateral sides;
the second interposer laterally covers a second die lateral side of the die lateral sides;
no interposer covers a third die lateral side of the die lateral side; and
no interposer covers a fourth die lateral side of the die lateral sides.

14. A sensor device comprising:
a sensor die having a die top side, a die bottom side, and die lateral sides;
a sensing area on the die top side;
a top side conductor, where at least a portion of the top side conductor is above the die top side;
a bottom side connection point;
a first interposer positioned laterally in relation to the sensor die, wherein:
the first interposer comprises a conductive via that electrically connects the top side conductor to the bottom side connection point; and
at least a portion of the conductive via is positioned directly laterally from the sensor die;
an encapsulant that covers at least the die lateral sides; and
a second interposer positioned laterally in relation to the sensor die and positioned such that the sensor die is laterally between the first interposer and the second interposer, and
wherein:
the first interposer comprises a first lateral side that faces in a same direction as a first die lateral side of the die lateral sides;
the second interposer comprises a second lateral side that faces in a same direction as a second die lateral side of the die lateral sides; and
the first lateral side of the first interposer and the second lateral side of the second interposer are exposed from the encapsulant.

15. The sensor device of claim 11, wherein:
the encapsulant covers a bottom side of the first interposer and the die bottom side; and
the encapsulant laterally spans an entirety of the first interposer.

16. The sensor device of claim 15, wherein
a top side of the first interposer and the die top side are not covered by the encapsulant.

17. The sensor device of claim 11, wherein a top side of the first interposer, the die top side, and a top side of the encapsulant are coplanar.

18. The sensor device of claim 11, wherein the sensing area is directly on the die top side.

19. The sensor device of claim 11, wherein
the interposer board comprises an outer lateral surface that faces directly away from the sensor die and is not covered by the encapsulant.

20. The sensor device of claim 1, comprising a first interposer positioned laterally in relation to the sensor die, wherein:
the first interposer comprises a first interposer board that comprises the conductive via; and
the first interposer board comprises an interior lateral surface that faces directly toward the sensor die and contacts the encapsulant.

* * * * *